United States Patent
Kim et al.

(10) Patent No.: US 7,902,563 B2
(45) Date of Patent: Mar. 8, 2011

(54) LIGHT EMITTING DIODE MODULE WITH HEAT SPREADING PLATE BETWEEN CAPPING LAYER AND PHOSPHOR LAYER

(75) Inventors: Yu-sik Kim, Suwon-si (KR); Hyung-kun Kim, Suwon-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 593 days.

(21) Appl. No.: 11/515,248

(22) Filed: Sep. 5, 2006

(65) Prior Publication Data

US 2007/0246712 A1  Oct. 25, 2007

(30) Foreign Application Priority Data

Apr. 25, 2006  (KR) .................. 10-2006-0037218

(51) Int. Cl.
*H01L 33/64* (2010.01)
(52) U.S. Cl. ....... 257/98; 257/99; 257/100; 257/E25.028
(58) Field of Classification Search .................. 257/94, 257/712, 98–100
See application file for complete search history.

(56) References Cited

U.S. PATENT DOCUMENTS

| | | | |
|---|---|---|---|
| 6,294,800 B1* | 9/2001 | Duggal et al. | 257/89 |
| 7,517,728 B2* | 4/2009 | Leung et al. | 438/122 |
| 2003/0218228 A1* | 11/2003 | Furukawa et al. | 257/432 |
| 2004/0173810 A1* | 9/2004 | Lin et al. | 257/100 |
| 2005/0173708 A1* | 8/2005 | Suehiro et al. | 257/79 |
| 2005/0253153 A1* | 11/2005 | Harada | 257/79 |
| 2006/0054915 A1* | 3/2006 | Chang | 257/100 |
| 2006/0171152 A1* | 8/2006 | Suehiro et al. | 362/363 |
| 2007/0131954 A1* | 6/2007 | Murayama et al. | 257/98 |
| 2008/0105887 A1* | 5/2008 | Narendran et al. | 257/98 |

* cited by examiner

*Primary Examiner* — Wael M Fahmy
*Assistant Examiner* — Abul Kalam
(74) *Attorney, Agent, or Firm* — Buchanan Ingersoll & Rooney PC

(57) ABSTRACT

A long life light-emitting diode (LED) module is provided. The LED module includes: a light-emitting chip; a phosphor layer formed of phosphor materials that transform light emitted from the light-emitting chip into light having a longer wavelength than the light emitted from the light-emitting chip; a capping layer that is formed on the light-emitting chip and protects the light-emitting chip; and a heat spreading plate that is disposed between the capping layer and the phosphor layer that dissipates heat generated in the light-emitting chip and the phosphor layer.

12 Claims, 7 Drawing Sheets

LIGHT EMITTING DIODE MODULE WITH HEAT SPREADING PLATE BETWEEN CAPPING LAYER AND PHOSPHOR LAYER

CROSS-REFERENCE TO RELATED PATENT APPLICATION

This application claims the benefit of Korean Patent Application No. 10-2006-0037218, filed on Apr. 25, 2006, in the Korean Intellectual Property Office, the disclosure of which is incorporated herein in its entirety by reference.

BACKGROUND OF THE DISCLOSURE

1. Field of the Disclosure

The present disclosure relates to a light-emitting diode (LED) module, and more particularly, to a LED module having an increased lifespan achieved by improving the degradation characteristics of a phosphor material when producing white light or other monochromatic light using a phosphor material and a LED emitting ultraviolet (UV) or blue light.

2. Description of the Related Art

LEDs are light-emitting sources made of a compound semiconductor, such as GaAs, AlGaN or AlGaAs, and generate light of various colors. Because LEDs are easier to fabricate or control than semiconductor lasers and have a longer lifespan than fluorescent lamps, they are emerging as promising illumination light sources for a next-generation display by replacing fluorescent lamps. With the recent advent of blue and UV LEDs made possible by using a nitride having excellent physical and chemical characteristics and because a blue or UV LED or phosphor material can be used to produce white light or other monochromatic light, LEDs are being used in a wider range of applications. For example, in a white LED module, UV light emitted from a LED chip excites phosphor materials to emit visible light of three primary colors—red (R), green (G) and blue (B)—or visible light of yellow (Y) and blue (B). The colors of the visible light emitted from the phosphor materials vary depending on the composition of the phosphor materials. When combined, all the colors of visible light appear to be white to human eyes.

FIG. 1 illustrates the structure of a conventional LED module. Referring to FIG. 1, the conventional LED module includes a light-emitting chip 1 disposed inside a concave slot within a base 6, and a first resin layer 3, a phosphor layer 4 filled with phosphor materials and a second resin layer 5 formed sequentially within the base 6. When light emitted from the light-emitting chip 1 is incident on the phosphor layer 4, energy is transferred to the phosphor materials so as to emit light having a longer wavelength than the incident light, thus creating white or monochromatic light. During this process, the phosphor materials are degraded due to heat generated by driving the light-emitting chip 1 and generated by converting the light emitted by the light-emitting chip 1 into light of a wavelength different than the light emitted by the light-emitting chip 1. Degradation of phosphor materials results in a reduced lifespan for the LED module. Thus, there is a need to improve the degradation characteristics of phosphor materials for the fabrication of a long life LED module.

SUMMARY OF THE DISCLOSURE

The present invention may provide a light-emitting diode (LED) module having an increased lifespan achieved by improving the degradation characteristics of a phosphor material when producing white light or other monochromatic light using phosphor material and LED emitting ultraviolet (UV) or blue light.

According to an aspect of the present invention, there may be provided a LED module including: a light-emitting chip; a phosphor layer formed of phosphor materials that transform light emitted from the light-emitting chip into light having a longer wavelength than the light emitted from the light-emitting chip; a capping layer that is formed on the light-emitting chip and protects the light-emitting chip; and a heat spreading plate that is disposed between the capping layer and the phosphor layer that dissipates heat generated in the light-emitting chip and the phosphor layer.

BRIEF DESCRIPTION OF THE DRAWINGS

The above and other features and advantages of the present invention are illustrated in detailed exemplary embodiments thereof with reference to the attached drawings in which.

DETAILED DESCRIPTION OF EXEMPLARY EMBODIMENTS

Figure 1:
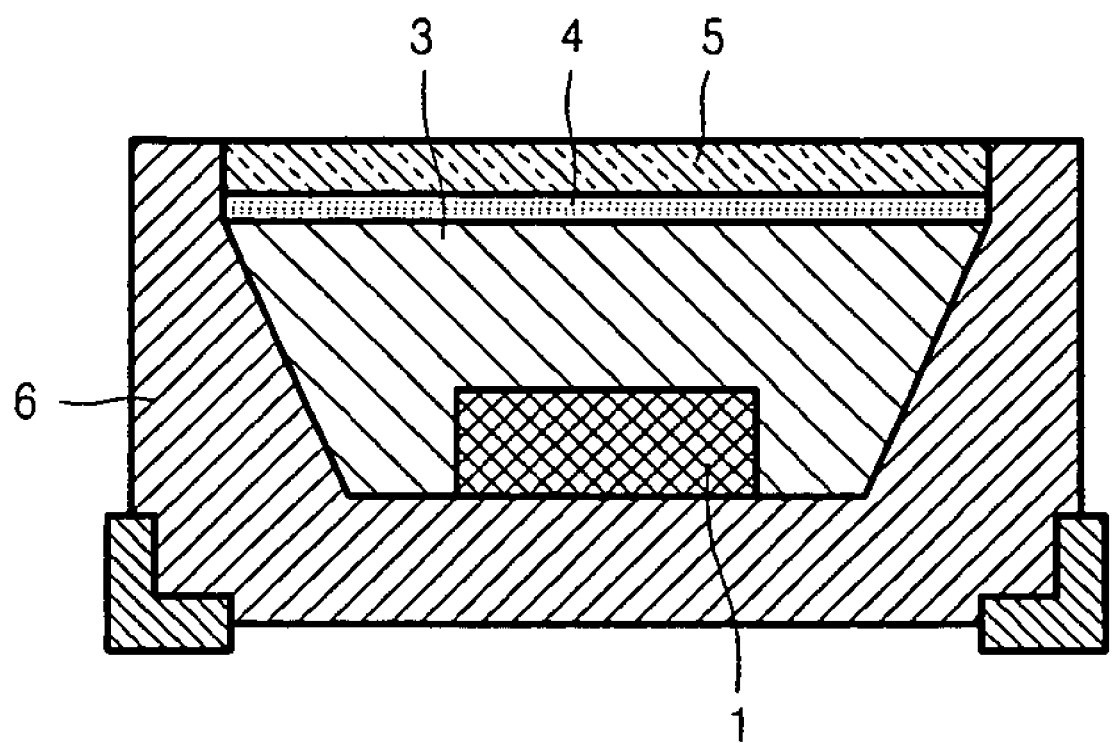
FIG. 1 is a schematic cross-sectional view of a conventional light-emitting diode (LED) module.

The present invention will now be described more fully with reference to the accompanying drawings, in which exemplary embodiments of the invention are shown. The invention may, however, be embodied in many different forms and should not be construed as being limited to the embodiments set forth herein. Accordingly, these embodiments are provided so that this disclosure will fully convey the concept of the invention to those skilled in the art in an exemplary manner. In the drawings, each element may be exaggerated for clarity and convenience.

Figure 2:
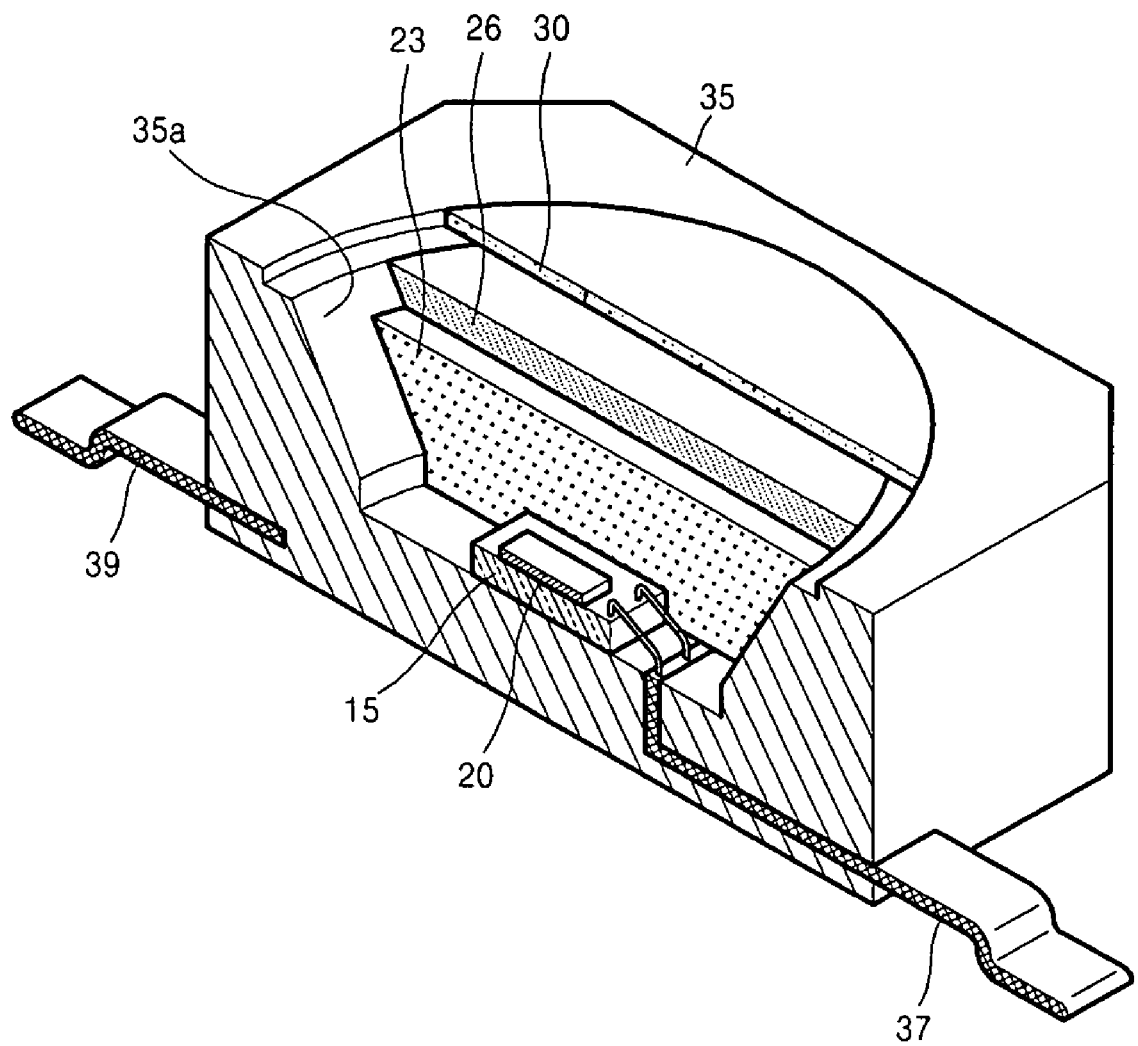
FIG. 2 is a broken away perspective view of a LED module according to an embodiment of the present invention.

FIG. 2 is a broken away perspective view of a LED module according to an embodiment of the present invention. Referring to FIG. 2, the LED module includes a light-emitting chip 20, a phosphor layer 30 emitting light of a longer wavelength than light emitted from the light-emitting chip 20 using the light emitted from the light-emitting chip 20 as an excitation source, a capping layer 23 that is formed on the light-emitting chip 20 and protects the light-emitting chip 20, and a heat spreading plate 26 that is disposed between the capping layer 23 and the phosphor layer 30 and spreads heat generated in the light-emitting chip 20 and the phosphor layer 30.

The light-emitting chip 20 is disposed on a submount 15 seated within a package housing 35 having an inner cup-shaped surface 35a. First and second lead frames 37 and 39 project outwardly from a lower portion of the package housing 35 and are electrically connected to n- and p-electrodes (not shown), respectively. The light-emitting chip 20 includes a p-semiconductor layer, an active layer, and an n-semiconductor layer. When a voltage is applied between the n- and p-electrodes through the first and second lead frames 37 and 39, holes from the p-semiconductor layer combine with electrons from the n-semiconductor layer in the active layer to generate light that is then emitted from the light-emitting chip 20.

Because the wavelength of light generated in the light-emitting chip 20 varies depending on the material and structure of the active layer, the material and structure are appropriately determined depending on the wavelength of light that is to be achieved by the LED module. The phosphor layer 30 is formed of phosphor materials that transform light emitted from the light-emitting chip 20 into light having a longer wavelength. When the light emitted by the light-emitting chip 20 is incident on the phosphor layer 30, the incident light transfers energy to the phosphor materials in the phosphor layer 30 and is transformed into lower energy light having a longer wavelength than the incident light before being emitted.

The capping layer 23 is formed to a height starting from a bottom surface of the package housing 35 so as to cover the light-emitting chip 20. The capping layer 23 protects the light-emitting chip 20 and increases the light extraction efficiency by reducing a refractive index difference from the light-emitting chip 20. The capping layer 23 may be formed of a material having a high refractive index and a high light transmittance, such as a resin.

The heat spreading plate 26 is disposed between the capping layer 23 and the phosphor layer 30 and prevents degradation of the phosphor layer 30 due to the heat generated by the light-emitting chip 20 or the phosphor layer 30. The heat spreading plate 26 is formed of a mixture of a light transmissive material and a highly thermally conductive material. For example, the light transmissive material may be a resin and the thermally conductive material may be $SiO_2$, $Al_2O_3$, AlN, or ZnO.

The heat spreading plate 26 formed of highly thermally conductive material dissipates and removes heat generated in the light-emitting chip 20 or the phosphor layer 30. For example, crystalline silica and spherical alumina may have a thermal conductivity of $200\times10^{-4}$ cal/cm·s·°C. and $860\times10^{-4}$ cal/cm·s·°C., respectively, which are much higher than that of a resin having thermal conductivity of 15 cal/cm·s·°C. Thus, the heat spreading plate 26 can transmit light while dissipating heat generated in the light-emitting chip 20 or the phosphor layer 30, thus suppressing the reduction in optical characteristics due to temperature. The ratio of the thermally conductive material mixed with the light transmissive material in the heat spreading plate 26 is determined depending on the thermal conductivity and transmittance of each material. In a preferred embodiment the mixture ratio of thermally conductive material to light transmissive material in the heat spreading plate is approximately 1:1 by weight.

In order to increase the suppressive effect, the capping layer 23 may be made of a mixture of a thermally conductive material and a light transmissive material comparable to the heat spreading plate 30. In a preferred embodiment the mixture ratio of thermally conductive material to light transmissive material in the capping layer is approximately 1:1 by weight.

For instance, in the heat spreading plate and/or the capping layer in a preferred embodiment the thermally conductive layer is silica and the light transmissive material is a resin and the mixture ratio of silica to resin is approximately 1:1 by weight.

Figure 3A:
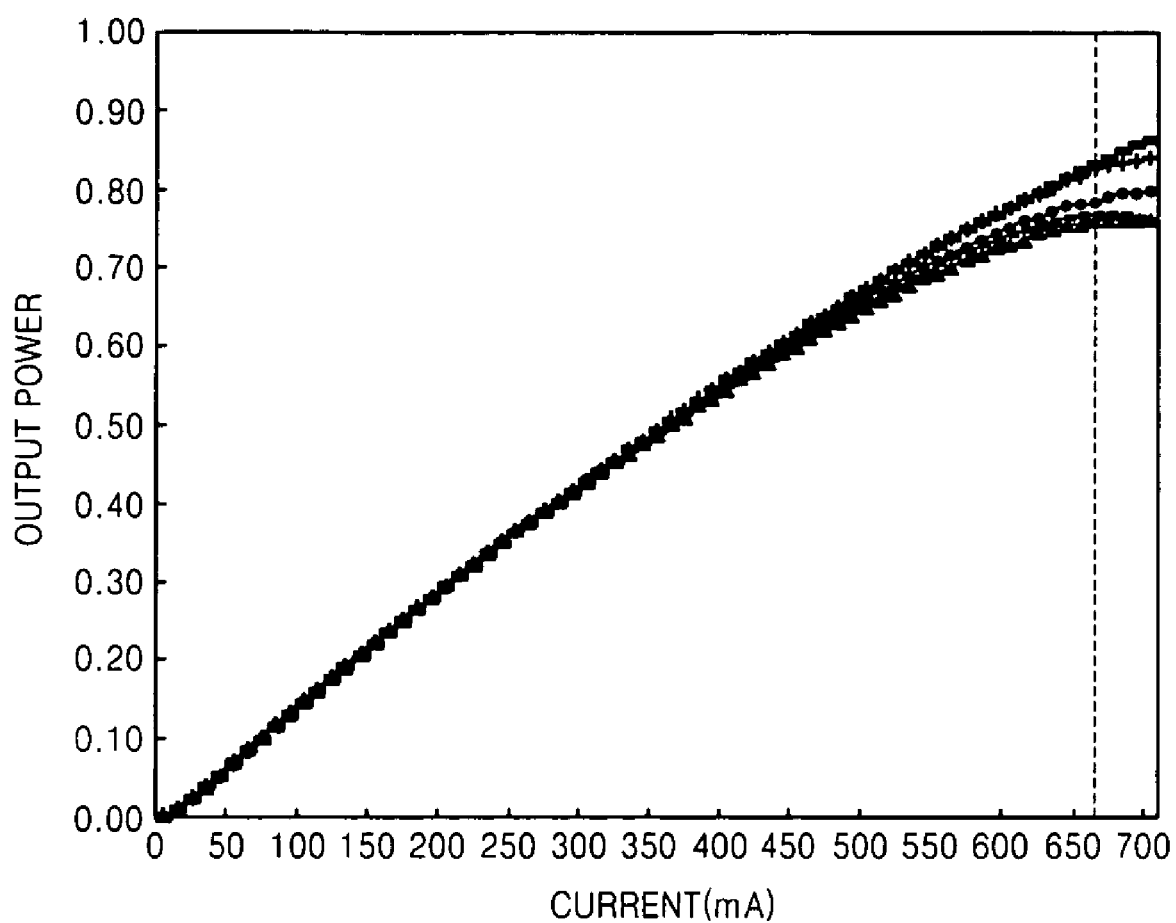
FIGS. 3A-3C are graphs illustrating the output power saturation characteristics for LED modules according to a comparative example and embodiments of the present invention.
Figure 3B:
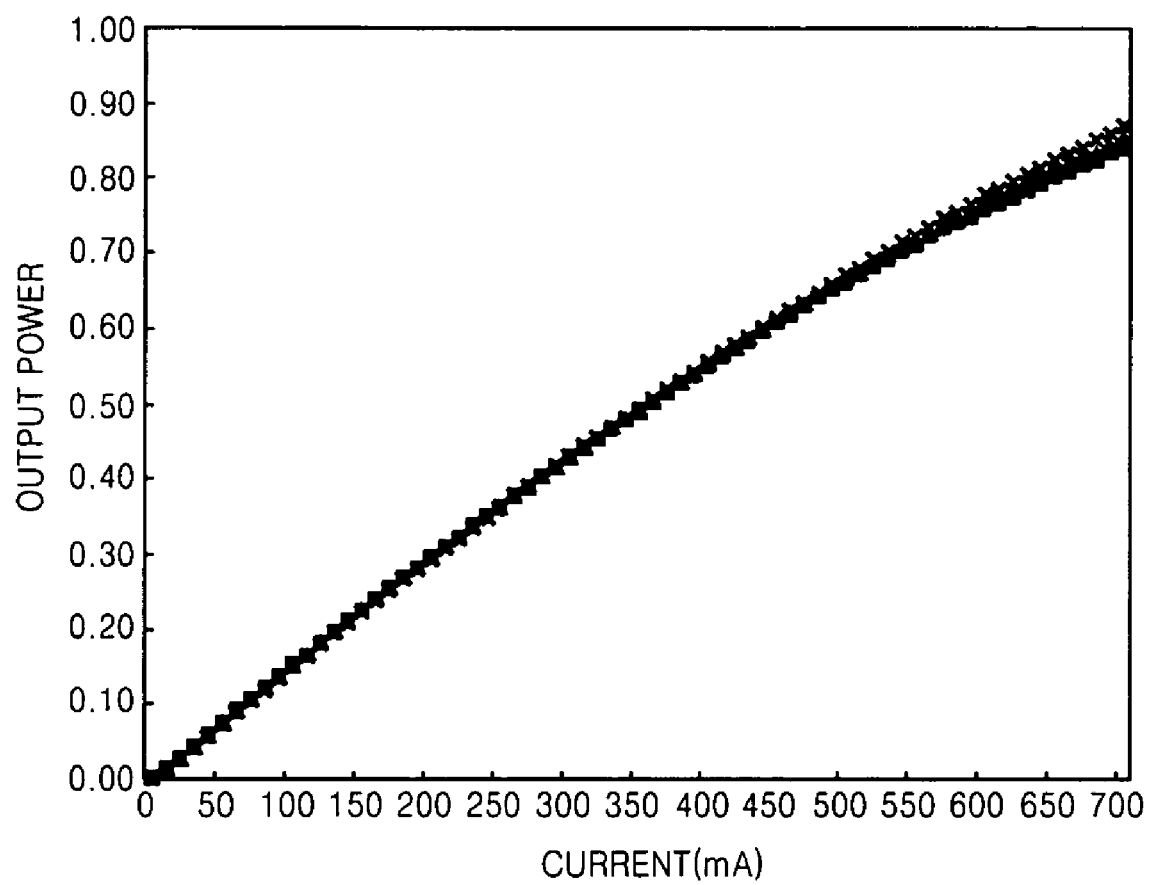
Figure 3C:
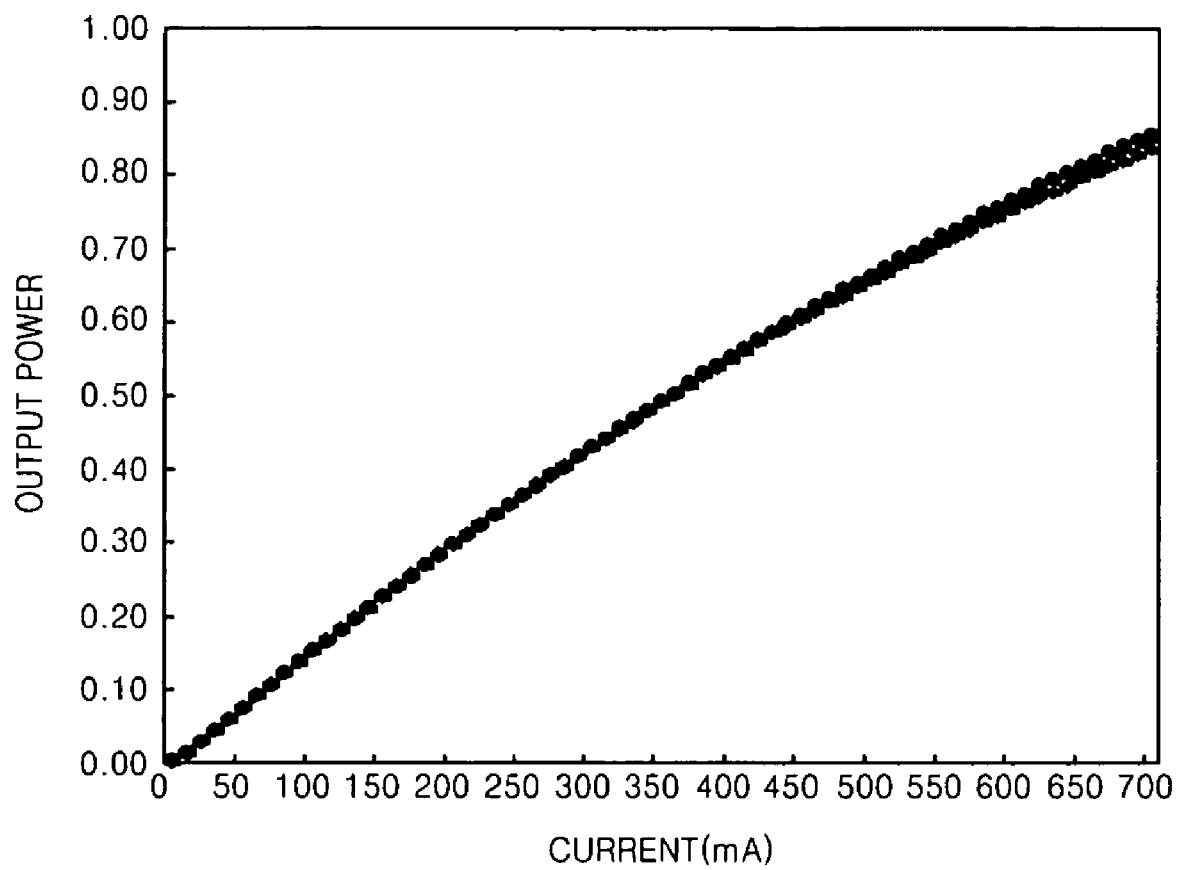

FIGS. 3A-3C are graphs illustrating output power saturation characteristics for a conventional LED module and LED modules according to first and second embodiments of the present invention. Table 1 illustrates materials of the capping layer 23 and the heat spreading plate 26 for the LED modules. The LED modules according to the first and second embodiments of the present invention have the same structure as shown in FIG. 2 but include the capping layers 23 and the heat spreading plates 26 of different materials.

TABLE 1

|  | Capping layer | Heat spreading plate |
| --- | --- | --- |
| Comparative example | Resin | Not present |
| Embodiment 1 | Resin | Silica + resin |
| Embodiment 2 | Silica + resin | Silica + resin |

In the Table 1, the mixture ratio of silica to resin is approximately 1:1 by weight. Light emitted from the light-emitting chip (20 of FIG. 2) used in the experiment is violet light having a wavelength region of about 400 nm and the phosphor layer (30 of FIG. 2) is made of a green phosphor material and emit green light having a wavelength region of about 535 nm. The output power saturation characteristics of a LED module are obtained by measuring changes in output power with respect to current.

As is evident from the graph illustrated in FIG. 3A, measurements were made on several samples and output power begins to be saturated for most of the samples when current is about 660 mA. Conversely, as evident from the graphs of FIGS. 3B and 3C illustrating the output power saturation characteristics of the LED modules according to the first and second embodiments of the present invention, no saturation of output power occurs until the current reaches about 700 mA. That is, the difference in the output power saturation characteristics among the LED modules according to the comparative example and the embodiments of the present invention is caused by the presence or absence of heat spreading plate.

Figure 4A:
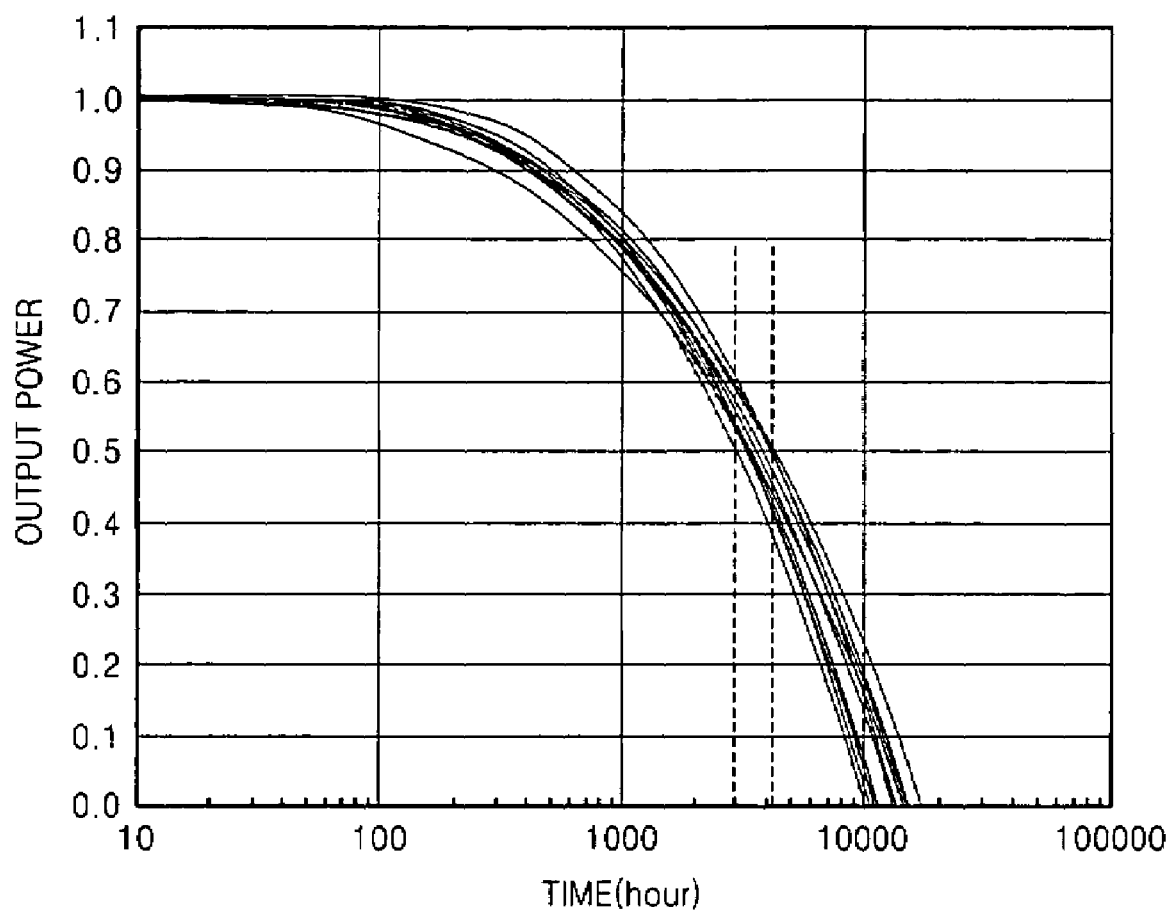
FIGS. 4A and 4B are graphs illustrating the results of an accelerated aging test for LED modules according to comparative example and embodiments of the present invention.
Figure 4B:
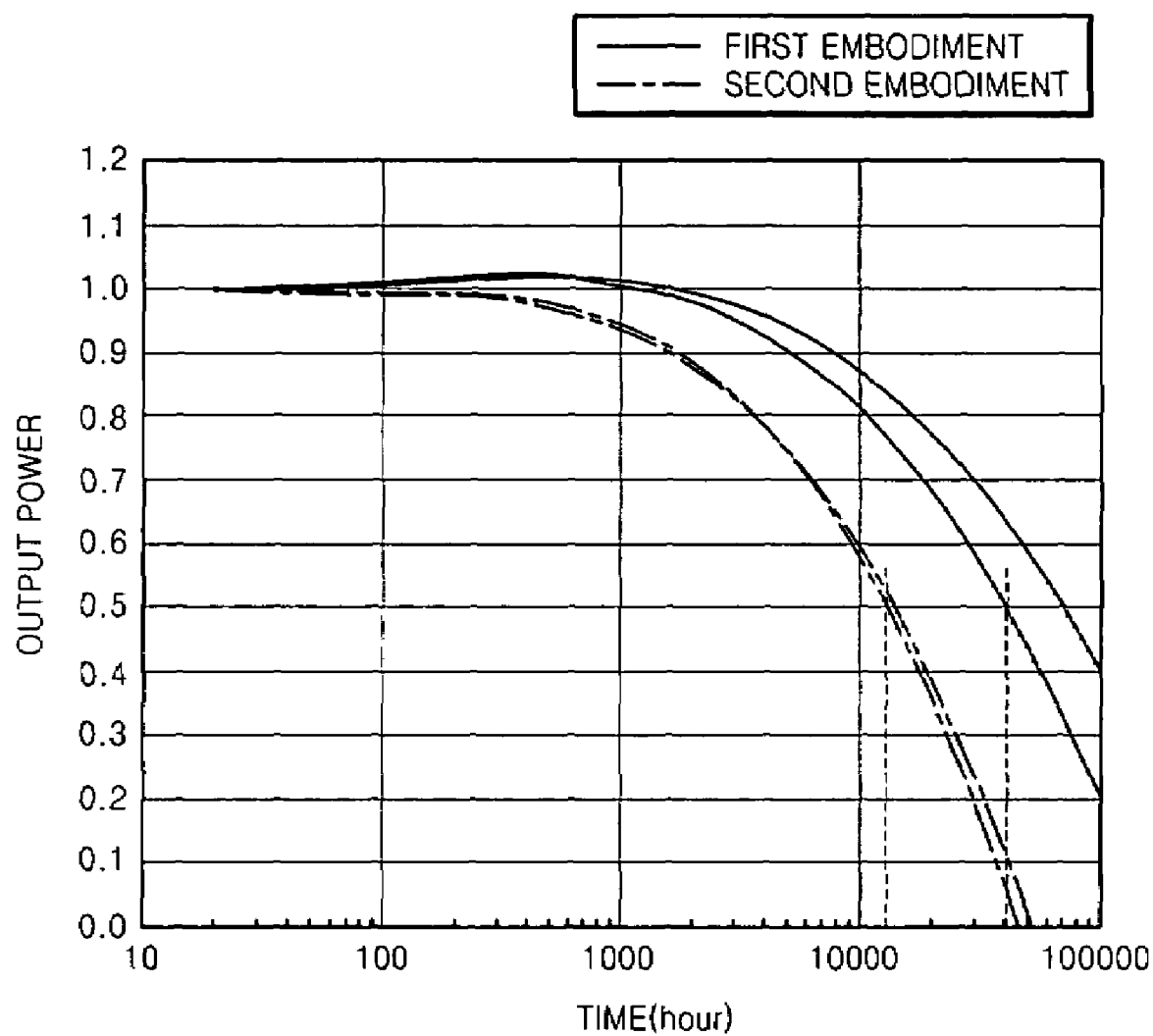

FIGS. 4A and 4B are graphs illustrating the lifespans of LED modules according to a comparative example and first and second embodiments of the present invention. The graphs illustrate the results of measurements made at temperature of 85° C. and a current of 350 mA for 1,000 hours. Predicted lifespans are determined at an output power that is 50% of initial output power. Referring to FIG. 4A, the conventional LED module is predicted to have a lifespan of about 3,000 to 4,500 hours. Referring to FIG. 4B, the LED modules according to the first and second embodiments of the present invention are predicted to have lifespans of 15,000 hours and more than 40,000 hours.

As is evident from the graphs of FIGS. 4A and 4B, the LED module according to the first embodiment has a lifespan that is about 3.3 to 5 times longer than the conventional LED module. The LED module according to the second embodiment has a lifespan more than about 13 times longer than the conventional LED module. The LED modules of the first and second embodiment have a significantly improved lifespan over the conventional LED module. Furthermore, the LED module of the second embodiment including a capping layer and a heat spreading plate formed of a mixture of a thermally conductive material and a light transmissive material as the capping layer (23 of FIG. 2) and the heat spreading plate (26 of FIG. 2) has a significantly longer lifespan than the other LED modules.

The results of the measurement of optical characteristics on the first and second embodiments of the present invention will now be described. Tables 2 through 4 show phosphor conversion efficiencies (PCEs) measured on LED modules according to the comparative example and the first and second embodiments of the present invention. A PCE refers to a ratio of the amount of output power emitted after phosphor conversion in a phosphor layer to the amount of output power emitted without phosphor conversion subtracted from the amount of output power emitted by a LED bare chip.

TABLE 2

|  | Violet output power- bare chip(W) | Violet output power - phosphor layer(W) | Green output power(W) | PCE (%) |
| --- | --- | --- | --- | --- |
| #1-1 | 0.168 | 0.024 | 0.096 | 66.76 |
| #1-2 | 0.168 | 0.003 | 0.083 | 50.04 |
| #1-3 | 0.170 | 0.024 | 0.094 | 64.36 |
| #1-4 | 0.172 | 0.007 | 0.090 | 54.77 |
| #1-5 | 0.166 | 0.003 | 0.083 | 50.88 |
| #1-6 | 0.194 | 0.058 | 0.096 | 71.21 |
| #1-7 | 0.197 | 0.038 | 0.107 | 67.62 |
| #1-8 | 0.198 | 0.034 | 0.109 | 66.09 |

As is evident from Table 2 showing the results of the measurement of eight (8) samples of conventional LED modules, the average value of PCE is about 61.46%.

TABLE 3

|  | Violet output power- bare chip(W) | Violet output power - phosphor layer(W) | Green output power(W) | PCE (%) |
| --- | --- | --- | --- | --- |
| #2-1 | 0.227 | 0.007 | 0.107 | 48.33 |
| #2-2 | 0.233 | 0.039 | 0.132 | 68.13 |
| #2-3 | 0.219 | 0.027 | 0.127 | 66.39 |
| #2-4 | 0.222 | 0.033 | 0.127 | 67.44 |
| #2-5 | 0.231 | 0.025 | 0.121 | 58.83 |

As is evident from Table 3 showing the results of the measurement of five (5) samples of LED modules according to the first embodiment of the present invention, the average value of PCE is about 61.82% and is almost the same as that for a conventional LED module. That is, a heat spreading plate does not have an effect on optical characteristics of a LED module of the first embodiment.

TABLE 4

|  | Violet output power- bare chip(W) | Violet output power - phosphor layer(W) | Green output power(W) | PCE (%) |
| --- | --- | --- | --- | --- |
| #3-1 | 0.225 | 0.029 | 0.108 | 55.37 |
| #3-2 | 0.227 | 0.032 | 0.104 | 53.51 |
| #3-3 | 0.242 | 0.020 | 0.121 | 54.31 |
| #3-4 | 0.217 | 0.005 | 0.092 | 43.17 |
| #3-5 | 0.231 | 0.019 | 0.109 | 51.59 |

As is evident from Table 4 showing the results of the measurement of five (5) samples of LED modules according to the second embodiment of the present invention, the average value of PCE is about 51.59% and is about 10% lower than the conventional LED modules and the LED modules according to the first embodiment. This is because the capping layer of the LED module according to the second embodiment has higher amount of silica than the conventional LED module and the LED module according to the first embodiment. This has an effect on the optical characteristics of the LED module according to the second embodiment. Thus, it can be determined whether a capping layer will contain only a light-transmissive material or a mixture of a light transmissive material and a thermally conductive material that may hamper optical characteristics when considering the output power characteristics and the lifespan of a LED module.

A LED module according to the present invention uses a heat spreading plate that spreads away heat generated in a phosphor layer and a light-emitting chip in order to suppress the degradation in optical characteristics due to temperature, thus making possible improved reliability and a long lifespan. Furthermore, because the heat spreading plate is less expensive than resin and the manufacturing costs are low, the LED module of the present invention is economical to fabricate.

While the present invention has been particularly shown and described with reference to exemplary embodiments thereof in order to aid in the understanding thereof, it will be understood by those of ordinary skill in the art that various changes in form and details may be made therein without departing from the spirit and scope of the present invention as defined by the following claims.

What is claimed is:

1. A LED (Light-emitting Diode) module comprising:
a package housing;
a light-emitting chip disposed inside the package housing;
a phosphor layer formed of phosphor materials that transform light emitted from the light-emitting chip into light having a longer wavelength than the light emitted from the light-emitting chip;
a capping layer that is formed on the light-emitting chip and protects the light-emitting chip; and
a heat spreading plate that is disposed between the capping layer and the phosphor layer that dissipates heat generated in the light-emitting chip and the phosphor layer,
wherein the phosphor layer and the capping layer are separated from each other by the heat spreading plate,
the heat spreading plate is in direct contact with the upper surface of the capping layer and the lower surface of the phosphor layer,
the heat spreading plate has a side surface in contact with the package housing and
none of the side surfaces of the heat spreading plate are exposed outside of the LED module.

2. The LED module of claim 1, wherein the heat spreading plate is formed of a mixture of a thermally conductive material and a light transmissive material.

3. The LED module of claim 2, wherein the thermally conductive material in the heat spreading plate is selected from the group consisting of $SiO_2$, $Al_2O_3$, AlN, and ZnO.

4. The LED module of claim 2, wherein the light-transmissive material in the heat spreading plate is a resin.

5. The LED module of claim 2, wherein the mixture ratio of thermally conductive material to light transmissive material is approximately 1:1 by weight.

6. The LED module of claim 2, wherein the thermally conductive material is silica and the light transmissive material is a resin and the mixture ratio of silica to resin is approximately 1:1 by weight.

7. The LED module of claim 1, wherein the capping layer is formed of resin.

8. The LED module of claim 1, wherein the capping layer is formed of a mixture of a thermally conductive material and a light transmissive material.

9. The LED module of claim 8, wherein the thermally conductive material in the capping layer is one selected from the group consisting of $SiO_2$, $Al_2O_3$, AlN, and ZnO.

10. The LED module of claim 8, wherein the light-transmissive material in the capping layer is resin.

11. The LED module of claim 8, wherein the mixture ratio of thermally conductive material to the light transmissive material is approximately 1:1 by weight.

12. The LED module of claim 8, wherein the thermally conductive material is silica and the light transmissive material is a resin, and the mixture ratio of silica to resin is approximately 1:1 by weight.

* * * * *